(12) United States Patent
Chen et al.

(10) Patent No.: US 9,997,427 B2
(45) Date of Patent: Jun. 12, 2018

(54) DISPLAY PANEL WITH DAM STRUCTURE

(71) Applicants: Yang-Chen Chen, Miao-Li County (TW); Nai-Fang Hsu, Miao-Li County (TW); Yu-Hsien Wu, Miao-Li County (TW)

(72) Inventors: Yang-Chen Chen, Miao-Li County (TW); Nai-Fang Hsu, Miao-Li County (TW); Yu-Hsien Wu, Miao-Li County (TW)

( * ) Notice: Subject to any disclaimer, the term of this patent is extended or adjusted under 35 U.S.C. 154(b) by 0 days. days.

(21) Appl. No.: 15/680,249

(22) Filed: Aug. 18, 2017

(65) Prior Publication Data

US 2018/0061728 A1 Mar. 1, 2018

(30) Foreign Application Priority Data

Aug. 23, 2016 (CN) .......................... 2016 1 0707135
Jan. 4, 2017 (CN) .......................... 2017 1 0003851

(51) Int. Cl.
| | |
|---|---|
| H01L 29/49 | (2006.01) |
| H01L 23/31 | (2006.01) |
| H01L 27/12 | (2006.01) |
| H01L 23/16 | (2006.01) |
| H01L 23/29 | (2006.01) |
| H01L 27/32 | (2006.01) |
| H01L 33/54 | (2010.01) |
| H01L 27/15 | (2006.01) |
| H01L 51/52 | (2006.01) |

(52) U.S. Cl.
CPC .......... *H01L 23/3192* (2013.01); *H01L 23/16* (2013.01); *H01L 23/3171* (2013.01); *H01L 27/124* (2013.01); *H01L 27/1248* (2013.01); *H01L 23/291* (2013.01); *H01L 23/293* (2013.01); *H01L 27/156* (2013.01); *H01L 27/3246* (2013.01); *H01L 27/3258* (2013.01); *H01L 33/54* (2013.01); *H01L 51/5253* (2013.01)

(58) Field of Classification Search
CPC . H01L 23/3192; H01L 23/16; H01L 23/3171; H01L 27/124
See application file for complete search history.

(56) References Cited

U.S. PATENT DOCUMENTS

2014/0061898 A1* 3/2014 Chen ................... H01L 23/3185
257/737

\* cited by examiner

*Primary Examiner* — Michael Shingleton
(74) *Attorney, Agent, or Firm* — McClure, Qualey & Rodack, LLP

(57) ABSTRACT

A display panel includes a first inorganic capping layer (INOCL) in a non-displaying area ($A_{ND}$) of a substrate, a first electrode in the $A_{ND}$ formed on the first INOCL, an organic capping layer (OCL) on the substrate overlapping at least a portion of the first electrode, and a first dam structure in the $A_{ND}$ positioned between a first lateral surface of the substrate and the OCL in top view. A first distance H is between the top surfaces of the first INOCL and the OCL in a normal direction of the substrate. The first dam structure has a first maximum dam height Hdam and a dam width Wdam. A second distance Lsr is a minimum distance from a third lateral surface of the first dam structure to a second lateral surface of the first electrode, wherein H, Lsr, Hdam and Wdam conform to the equation: H×(0.1870−Wdam/(2.46×Lsr))≤Hdam≤H×(0.9548−Wdam/(44.26×Lsr)).

12 Claims, 7 Drawing Sheets

DISPLAY PANEL WITH DAM STRUCTURE

This application claims the benefit of People's Republic of China application Serial No. 201610707135.0, filed Aug. 23, 2016, and the benefit of People's Republic of China application Serial No. 201710003851.5, filed Jan. 4, 2017, the subject matters of which are incorporated herein by references.

BACKGROUND

Technical Field

The disclosure relates in general to a display panel, and more particularly to a display panel with dam structure.

Description of the Related Art

Electronic products with display panel, such as smart phones, tablets, notebooks, monitors, and TVs, have become indispensable necessities to modern people no matter in their work, study or entertainment. With a flourishing development of the portable electronic products, the consumers have higher expects on the functions, the specifications and the prices of the products. Different displaying techniques have been well-developed. For example, liquid crystal display (LCD) has several advantages of lightweight, compactness, portability and low price, which has replaced the CRT monitors and becomes one of the most commonly-used displays in the electronic products. Besides LCD displaying technique, the displaying techniques also include organic light-emitting diode (OLED) displaying technique, inorganic light-emitting diode technique (LED), and quantum dot light-emitting diode technique (QLED). Compared to the LCD, the self emission light-emitting display without a backlight not only saves more energy but also be lighter and thinner, which becomes one of important displays in the displaying technique.

SUMMARY

The disclosure is directed to a structural design for disposing at least one dam structure in a non-displaying area of a display panel.

According to one embodiment, a display panel is provided, comprising: a substrate having a displaying area and a non-displaying area adjacent to the displaying area, and the substrate having a first lateral surface; a first inorganic capping layer disposed on the substrate and corresponding to the non-displaying area and the first inorganic capping layer having a first top surface; a first electrode disposed on the first inorganic capping layer and corresponding to the non-displaying area, the first electrode having a second lateral surface adjacent to the first lateral surface of the substrate; an organic capping layer formed on the substrate and overlapping at least a portion of the first electrode, wherein the organic capping layer has a second top surface, and there is a first distance H between the first top surface of the first inorganic capping layer and the second top surface of the organic capping layer in a normal direction of the substrate; and a first dam structure disposed on the substrate and corresponding to the non-displaying area, the first dam structure disposed between the first lateral surface of the substrate and the organic capping layer in top view, the first dam structure having a first maximum dam height (Hdam) and a dam width (Wdam), and the first dam structure comprising a third lateral surface adjacent to the second lateral surface of the first electrode, wherein a second distance Lsr is defined as a minimum distance from the third lateral surface of the first dam structure to the second lateral surface of the first electrode in top view; wherein the first maximum dam height Hdam, the dam width (Wdam), the first distance H, and the second distance Lsr conform to as the following equation: $H\times(0.1870-Wdam/(2.46\times Lsr)) \leq Hdam \leq H\times(0.9548-Wdam/(44.26\times Lsr))$.

The disclosure will become apparent from the following detailed description of the preferred but non-limiting embodiments. The following description is made with reference to the accompanying drawings.

DETAILED DESCRIPTION

Figure 1A:
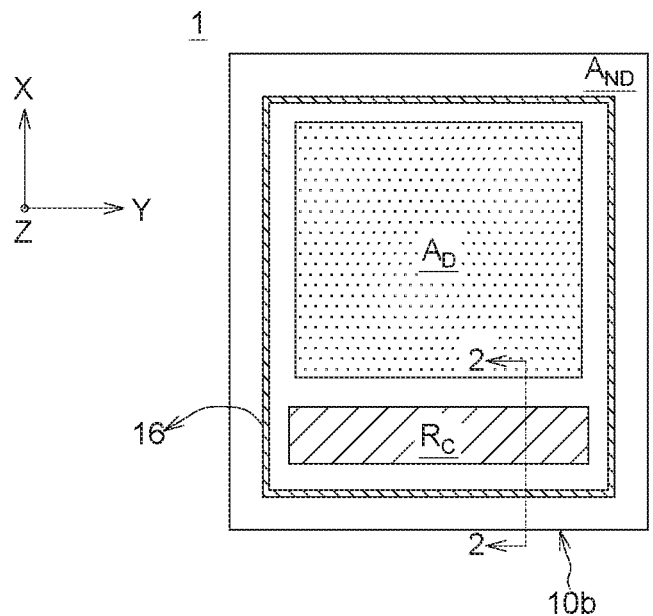
FIG. 1A is a top view of a display panel according to the first embodiment of the disclosure.

Light emitting layer of an organic light emitting diode (OLED) display panel, an inorganic light emitting diode (LED) display panel, or a quantum dot light emitting diode (QLED) display panel, the organic capping layer of the display panel would be easily affected by water vapor/oxygen permeance. Thus, the resistance to the water vapor and oxygen and the overflow of the organic capping layer should be considered during thin film encapsulation (encapsulation process using at least one thin film layer). In the embodiments of the disclosure, at least one dam structure is disposed in an non-displaying area of a display panel, which is able to control the boundary of the organic capping layer during thin film encapsulation, thereby solving the overflow problem of an organic capping layer during thin film encapsulation of the traditional structure, and increasing the path length of water vapor/oxygen permeance into the displaying area to affect the performance of diodes; consequently, the life time and quality of the display panel would be significantly improved. In the embodiments, the dam structure can be, continuously or non-continuously (with a plurality of segments), disposed adjacent and correspondingly to at least one side of the displaying area. For example, the dam structure is non-continuously disposed adjacent and correspondingly to one, two, three, four or more sides of the displaying area, or continuously disposed around one, two, three, four or more sides of the displaying area. Also, the embodiment demonstrates a height of a dam structure disposed on one side of the non-displaying area.

The following descriptions with reference to the accompanying drawings are made for illustrating the embodiments of the disclosure. The embodiments of the disclosure can be implemented in the encapsulation applications with at least one thin film (such as one inorganic capping layer, or three layers with inorganic capping layer/organic capping layer/inorganic capping layer stacking) between two substrates (such as a flexible opposite substrate and a flexible array substrate) of an organic light-emitting diode (OLED) displaying device, an inorganic light-emitting diode display device, or a quantum dot light-emitting diode display device. However, the structural details and embodied contents are provided for illustration, and the present disclosure is not limited thereto. It is noted that not all embodiments of the disclosure are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. Moreover, the identical and/or similar elements of the embodiments are designated with the same and/or similar reference numerals. The identical and/or similar elements of the embodiments are designated with the same and/or similar reference numerals.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. In the following embodiments, thin-film transistor (TFT) array substrates of OLED display panels are exemplified for illustration, but the disclosure is not limited to those exemplifications.

First Embodiment

Figure 1B:
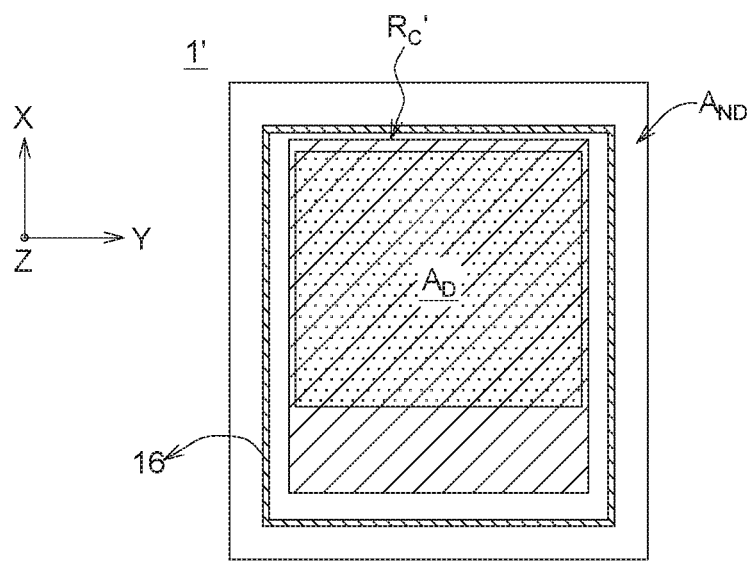
FIG. 1B is a top view of another display panel according to the first embodiment of the disclosure.

FIG. 1A is a top view of a display panel according to the first embodiment of the disclosure. FIG. 1B is a top view of another display panel according to the first embodiment of the disclosure. As shown in FIG. 1A and FIG. 1B, each substrate of the display panels 1 and 1' of the embodiment comprises a displaying area $A_D$ and a non-displaying area $A_{ND}$ around the displaying area $A_D$, a plurality of display unit (e.g., organic light emitting diode sub-pixels with anode electrode/light emitting layer/cathode electrode stacking structure), a first electrode region Rc/Rc' (region for disposing a cathode electrode or an anode electrode for an organic light emitting diode sub-pixel unit of the OLED display panel, or other electrode for driving circuit) disposed in (within) the non-displaying area $A_{ND}$ (overlaps with non-displaying area $A_{ND}$) or partially overlaps with the displaying area $A_D$ and the non-displaying area $A_{ND}$, and a first dam structure 16 disposed in the non-displaying area $A_{ND}$, wherein the first dam structure 16 is continuously disposed adjacent to and correspondingly to at least one side of the displaying area $A_D$, such as around one, two, three or four sides of the displaying area $A_D$ (one enclosing rectangle is exemplified as the first dam structure 16 in FIG. 1A and FIG. 1B), and the first dam structure 16 is positioned between the lateral surface (ex: the first lateral surface 10a as described later) of the substrate and the first electrode region Rc/Rc'. In other embodiments, the first dam structure 16 of the display panel can be disposed non-continuously at one, two, three, or four sides of the displaying area. The present disclosure is not particularly limited thereto. The displaying area $A_D$, the non-displaying area $A_{ND}$ and the first electrode region Rc/Rc' of the display panel are known elements to people skilled in the art, and the details thereof are not redundantly described herein.

The difference between the configurations of FIG. 1A and FIG. 1B is the disposition of the first electrode regions Rc and Rc'. That is, the first electrode region Rc of FIG. 1A is disposed in the non-displaying area $A_{ND}$ and adjacent to one side of the displaying area $A_D$, wherein an electrode in the non-displaying area $A_{ND}$ and an electrode in the displaying area $A_D$ can be electrically connected, but FIG. 1A merely depicts the electrode in the non-displaying area $A_{ND}$. The first electrode region Rc' of FIG. 1B can be extended from the non-displaying area $A_{ND}$ to the displaying area $A_D$ (partially overlaps with non-displaying area $A_{ND}$ and the displaying area $A_D$) and further extended across the entire displaying area $A_D$. However, the disclosure has no limitation to the disposition of the first electrode region. In other embodiments, the first electrode region Rc can be disposed in the non-displaying area $A_{ND}$ and adjacent to two sides or three sides of the displaying area $A_D$. Also, there is no limitation to the electrical connection between the electrode in the non-displaying area $A_{ND}$ and the electrode in the displaying area $A_D$; for example, the electrode in the non-displaying area $A_{ND}$ can be electrically connected to the electrode in the displaying area $A_D$ through vias or directly extended to the displaying area $A_D$. The first electrode region Rc disposed in the non-displaying area $A_{ND}$ can be corresponding to driving circuit on display panel (e.g., gate driver on panel (GOP), or data driver on panel (DOP)). In the following descriptions, a cross-sectional view of the display panel in FIG. 1A is exemplified for illustrating the embodiments.

Figure 2:
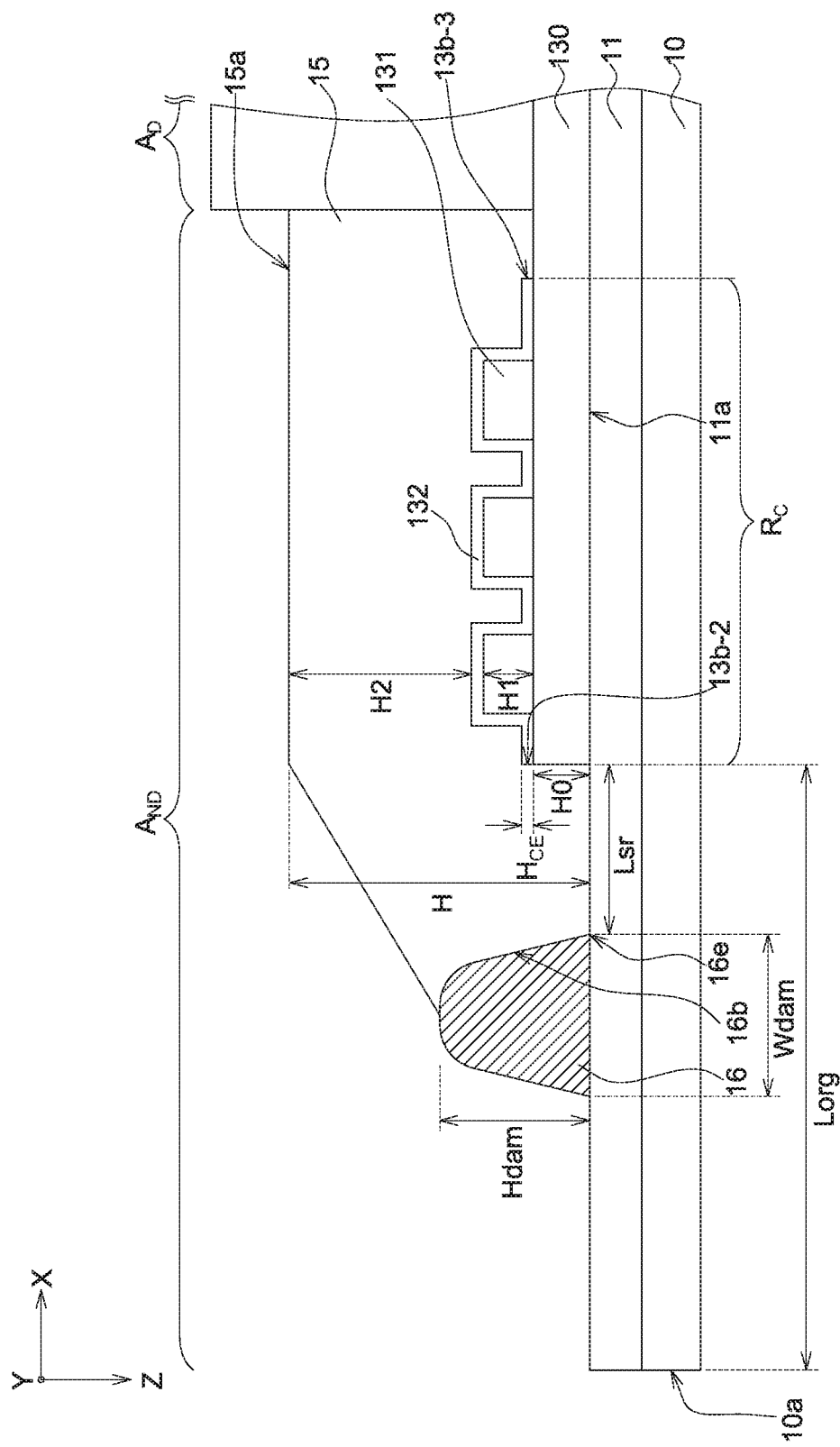
FIG. 2 is a cross-sectional view of parts of the display panel in FIG. 1A along the cross-sectional line 2-2.

FIG. 2 is a cross-sectional view of parts of the display panel in FIG. 1A along the cross-sectional line 2-2. Please refer to FIG. 1A and FIG. 2. The display panel 1 of the embodiment comprises a substrate 10 (having a displaying area $A_D$ and a non-displaying area $A_{ND}$), an inorganic capping layer 11 (such as a dielectric layer or a buffer layer) disposed on the substrate 10, a planarization layer 130 disposed on the inorganic capping layer 11, a pixel define layer (PDL) 131 disposed on the planarization layer 130, an electrode 132 disposed on the planarization layer 130, the electrode 132 disposed in the non-displaying area $A_{ND}$ (from top view) and formed on the inorganic capping layer 11, a first dam structure 16 disposed in the non-displaying area $A_{ND}$, an organic capping layer 15 disposed on the inorganic capping layer 11 and covering the electrode 132, and the organic capping layer 15 contacts with the first dam structure 16. The substrate 10 includes a first lateral surface 10a (i.e. perpendicular to and connecting the top surface and the bottom surface of the substrate 10). The inorganic capping layer 11 includes a top surface 11a, the first dam structure 16 has an outer edge adjacent to the first lateral surface 10a, and the outer edge of the first dam structure 16 is located between the first lateral surface 10a of the substrate 10 and the organic capping layer 15 from top view. The first dam structure 16 is partially overlapped with the organic capping layer 15 from top view.

In the embodiment, the electrode 132 has a second lateral surface 13b-2 and a third lateral surface 13b-3 opposite to the second lateral surface 13b-2, and the second lateral surface 13b-2 is adjacent to the first lateral surface 10a of the substrate 10 than the third lateral surface 13b-3.

In the non-displaying area $A_{ND}$ of the embodiment, the pixel define layer 131 is defined correspondingly to the electrode 132, and the electrode 132 is formed on the pixel define layer 131. Also, the second lateral surface 13b-2 is close to the first dam structure 16.

Also, the organic capping layer 15 is formed on the substrate 10 and covers the electrode 132, and the organic capping layer 15 has a top surface 15a. A first distance H is between the top surface 11a of the inorganic capping layer 11 and the top surface 15a of the organic capping layer 15 along a normal direction of the substrate 10. As shown in FIG. 2, the first distance H of the embodiment is vertical to the top surface 11a of the inorganic capping layer 11 and substantially parallel to the first lateral surface 10a of the substrate 10 or the second lateral surface 13b-2 of the electrode 132.

According to the embodiment, the first dam structure 16 has a first maximum dam height Hdam and a dam width Wdam in a cross-sectional view which is substantially perpendicular to the extended direction of the first dam 16. Also, the first dam structure 16 includes a fourth lateral surface 16b adjacent to the second lateral surface 13b-2 of the electrode 132. In one embodiment, the first dam structure 16 is disposed on the top surface 11a of the inorganic capping layer 11, and the bottom edge 16e of the fourth lateral surface 16b contacts the top surface 11a of the inorganic capping layer 11. In one embodiment, the first dam structure 16 has a bottom surface connecting the bottom edge 16e of the fourth lateral surface 16b, and the bottom surface contacts the top surface 11a of the inorganic capping layer 11, wherein the bottom surface has a dam width Wdam.

Practically, the first dam structure 16 can be formed during fabrication of the pixel define layer 131. Therefore, the first dam structure 16 and the pixel define layer 131 may include the same material. However, the disclosure is not limited thereto. In one embodiment, the first dam structure 16 is made of the materials comprising carbon (C) or oxygen (O) or nitrogen (N).

Figure 3:
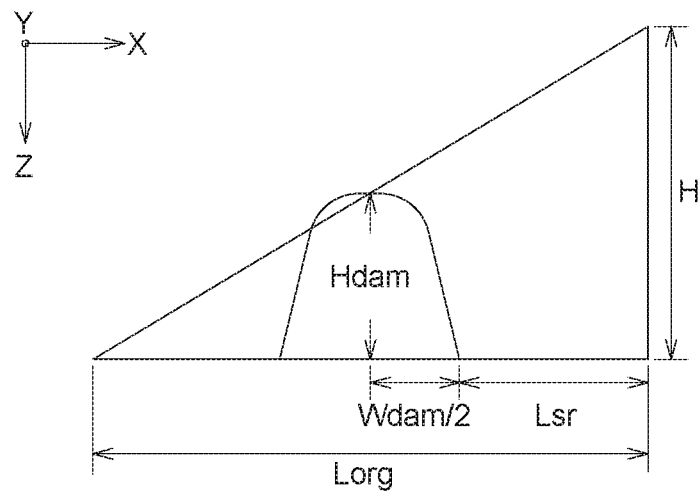
FIG. 3 is an enlarging drawing of a part of the structure in FIG. 2.

FIG. 3 is an enlarging drawing of a part of the structure in FIG. 2. Please refer to FIG. 2, there is a first distance H between the top surface 11a of the inorganic capping layer 11 and the top surface 15a of the organic capping layer 15. A minimum distance Lsr is defined by a distance between a projection of the second lateral surface 13b-2 of the electrode 132 on the substrate 10 to a projection of the bottom edge 16e of the fourth lateral surface 16b of the first dam structure 16 on the substrate 10 in the cross-sectional view. Additionally, there is another minimum distance Lorg defined by a distance between a projection of the second lateral surface 13b-2 of the electrode 132 on the substrate 10 to the first lateral surface 10a of the substrate 10 in the cross-sectional view. As shown in FIG. 3, the first distance H, the minimum distance Lorg as described above, and the connection between the highest point of the first distance H and one end of the minimum distance Lorg constitutes a right triangle. The first maximum dam height Hdam can be obtained by calculating the equation of (Lorg−Lsr−Wdam/2)×(H/Lorg). It is assumed that the upper limit of Lorg is expressed as Lorg=a×Lsr and the lower limit of Lorg is expressed as Lorg=b×Lsr. The upper limit of the first maximum dam height Hdam would be expressed by:

$$Hdam = (Lorg - Lsr - Wdam/2) \times (H/Lorg)$$
$$= (a \times Lsr - Lsr - Wdam/2) \times (H/(a \times Lsr))$$
$$= H - H/a - (Wdam \times H)/(2 \times a \times Lsr)$$
$$= H(1 - (1/a) - (Wdam/2 \times a \times Lsr))$$

Thus, it is obtained that the first maximum dam height Hdam is between H(1−(1/b)−(Wdam/2×b×Lsr)) and H(1−(1/a)−(Wdam/2×a×Lsr)).

To obtain the upper limit and the lower limit of the first maximum dam height Hdam, the equation (1) is represented as below by replacing the values of a and b, wherein a is 22.13 and b is 1.23.

$$H \times (0.1870 - Wdam/(2.46 \times Lsr)) \leq Hdam \leq H \times (0.9548 - Wdam/(44.26 \times Lsr)) \quad (1).$$

Accordingly, in practical application, the first distance H, the dam width Wdam, and the minimum distance Lsr can be applied into the equation (1) above to obtain the upper limit and the lower limit of the first maximum dam height Hdam of the first dam structure 16. The height of the first dam structure 16 within the upper limit and the lower limit can be applied in practical application. In one embodiment, the cross section of the first dam structure 16 has a symmetrical shape with the first maximum dam height Hdam as the axis of symmetry (the first dam structure 16 is, for example, a symmetrical bump). However, in other embodiments, the shape of the first dam structure 16 may be asymmetric.

Second Embodiment

Figure 4A:
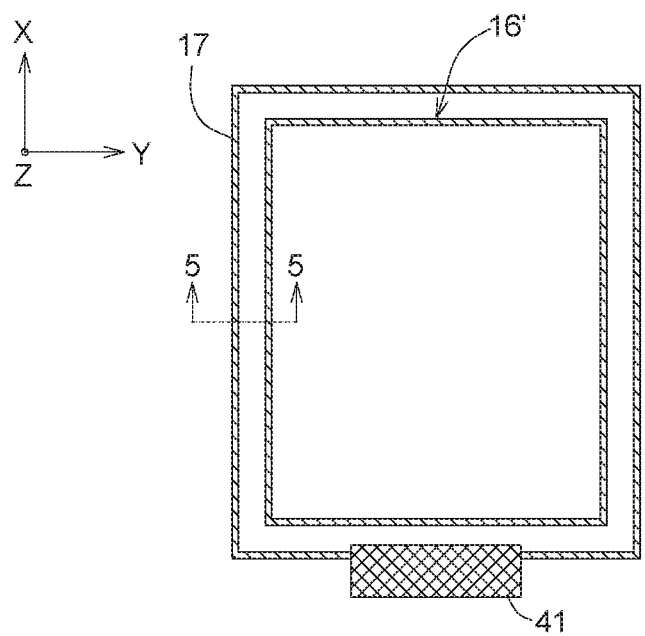
FIG. 4A-FIG. 4C show three different types of the first dam structures and the second dam structures of the display panels according to the second embodiment of the disclosure.
Figure 4B:
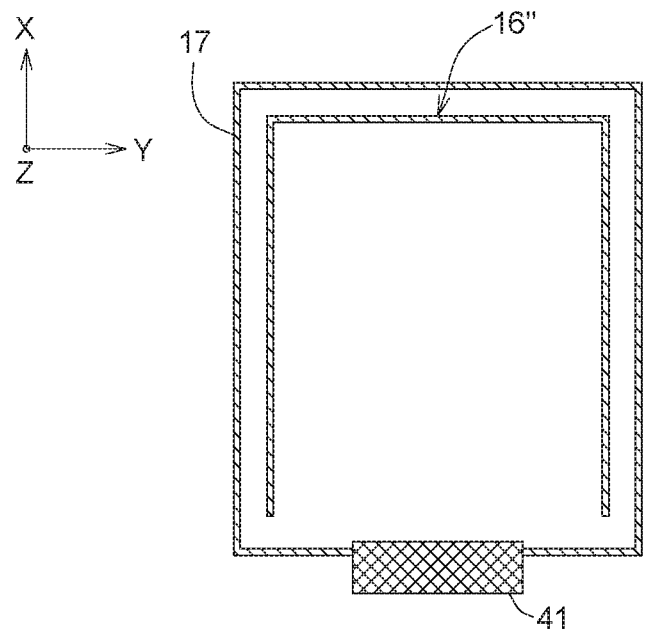
Figure 4C:
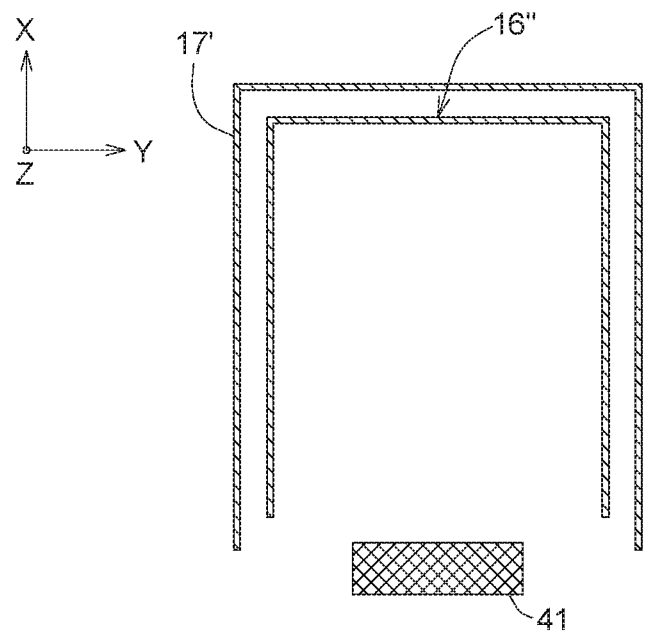

Besides the first dam structure 16 disclosed in the first embodiment, a display panel may further comprise a second dam structure 17 disposed at outside of the first dam structure 16'. Please refer to FIG. 4A-FIG. 4C, which show three different types of the first dam structures and the second dam structures of the display panels according to the second embodiment of the disclosure in top view, wherein the first dam structures 16'/16" and the second dam structures 17/17' can be continuously or non-continuously disposed correspondingly to at least one side of the displaying area. The first dam structures 16'/16" and the second dam structures 17/17' can be configured similarly, such as enclosing rectangles for surrounding the displaying area, and the second dam structures 17 are positioned outside of the first dam structures 16', as shown in FIG. 4A. In other embodiment, one of the first and second dam structures is an enclosing rectangle while the other is only disposed around three sides of the displaying area, as shown in FIG. 4B; alternatively, both of the first and second dam structures are disposed around three sides of the displaying area, as shown in FIG. 4C. The opening of the first dam structures 16' and/or the second dam structures 17' is, for example, toward the peripheral circuit 41 for signal reception, as shown in FIG. 4B and FIG. 4C. Additionally, in the top view of the displaying area, the non-displaying area, the first electrode region and the dam structures of the display panel can be referred to the dispositions of FIG. 1A and FIG. 1B. It is noted that the relative positions of the related elements and regions/areas are provided for illustration, not for being the only implemented type or for limiting the disclosure.

Figure 5:
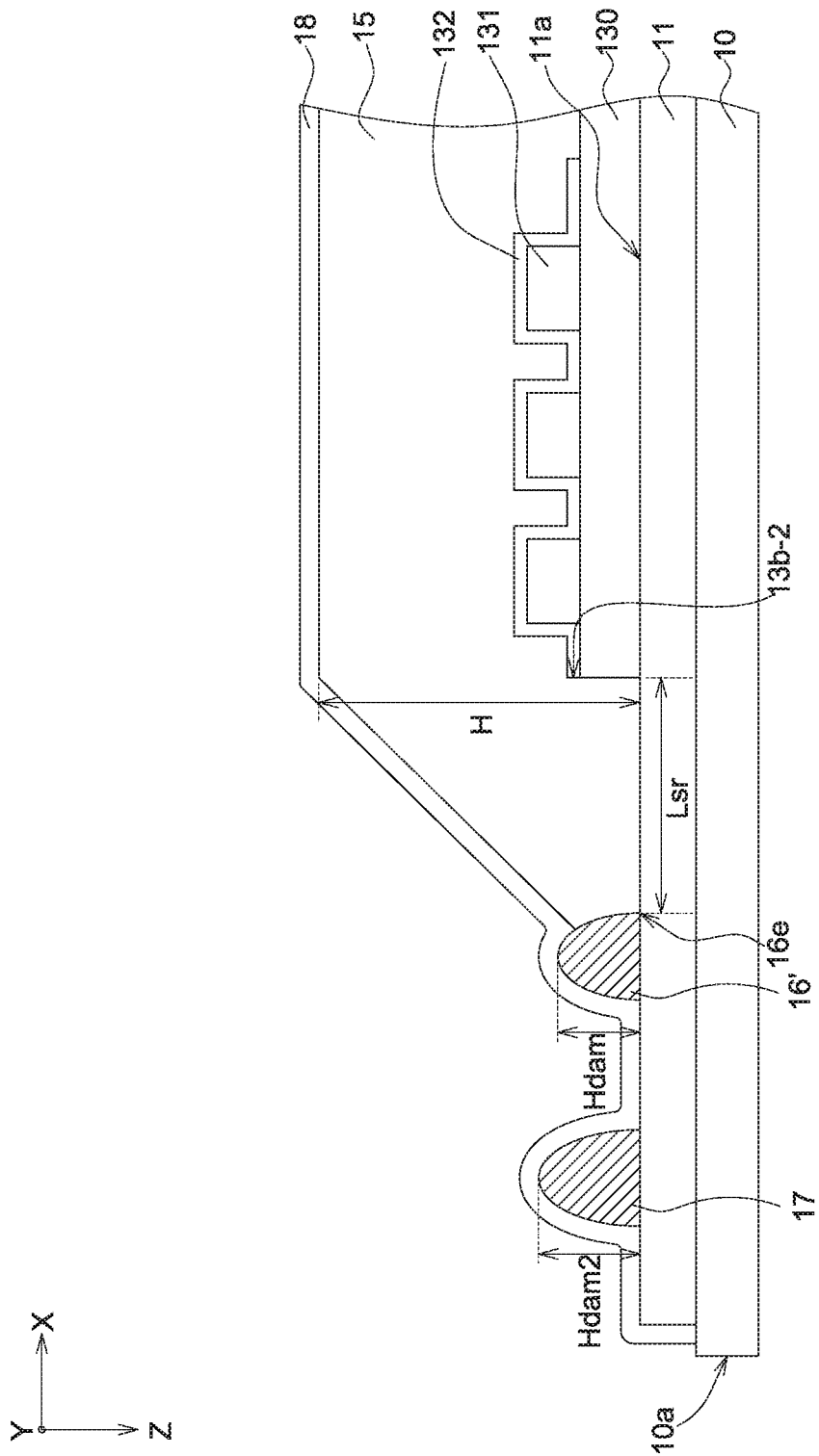
FIG. 5 is a cross-sectional view of parts of the display panel in FIG. 4A along the cross-sectional line 5-5.

FIG. 5 is a cross-sectional view of parts of the display panel in FIG. 4A along the cross-sectional line 5-5. The identical and/or similar elements of FIG. 5 and FIG. 2 are designated with the same and/or similar reference numerals for clear illustration. Also, please refer to the aforementioned descriptions for the structural details of the same elements and related layers of the display panels between the first and second embodiments, such as the substrate 10, the inorganic capping layer 11, the planarization layer 130, the pixel define layer 131, the electrode 132, the organic capping layer 15, the first dam structure 16' and etc., and the details thereof are not redundantly described herein.

As shown in FIG. 5, besides the first dam structure 16' disposed between the first lateral surface 10a of the substrate 10 and the organic capping layer 15, the display panel of the second embodiment further comprises a second dam structure 17 disposed between the first dam structure 16' and the first lateral surface 10a of the substrate 10 in top view. In one embodiment, the first dam structure 16' is spaced apart from the second dam structure 17 by a distance ranged from 45 μm to 105 μm. In another embodiment, the first dam structure 16' and the second dam structure 17 are apart from each other from by a distance ranged from 60 μm to 70 μm.

Additionally, the second maximum dam height Hdam2 of the second dam structure 17 can be greater than the first maximum dam height Hdam of the first dam structure 16', as shown in FIG. 5. However, the heights of these two dam structures are not particularly limited. The height of the second dam structure 17 can be less than, equal to, or greater than the height of the first dam structure 16', and all of those situations are implementable in the disclosure.

Also, the display panel of the first embodiment and/or second embodiment may further comprise a second inorganic capping layer 18 disposed on the organic capping layer 15. The organic capping layer 15 is disposed between the inorganic capping layer 11 (i.e. the first inorganic capping layer) and the second inorganic capping layer 18. As shown in FIG. 5, the second inorganic capping layer 18 of the second embodiment covers the first dam structure 16' and further covers the second dam structure 17. It is noted that the meanings of the term "covers" include entire covering and partial covering. It is implementable as long as the second inorganic capping layer 18 is disposed on the dam structure(s) and at least partially contacts the dam structure(s).

Figure 6A:
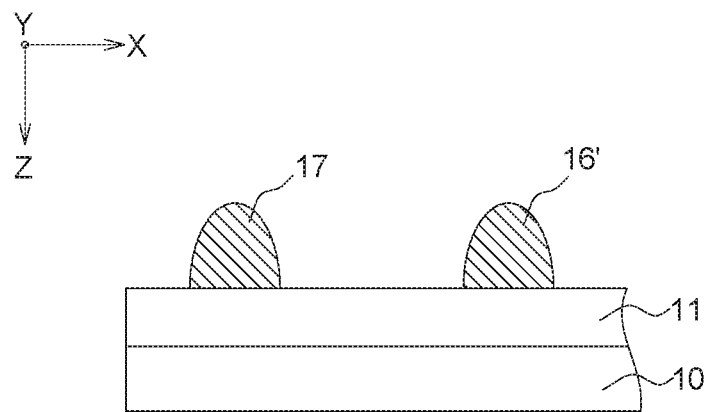
FIG. 6A and FIG. 6B show two different types of the second dam structure and the first inorganic capping layer of the display panels according to the second embodiment of the disclosure.
Figure 6B:
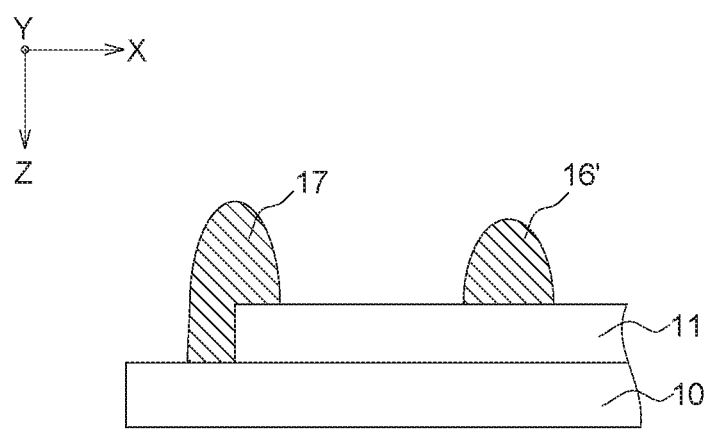

Additionally, FIG. 6A and FIG. 6B show two different types of the second dam structure and the first inorganic capping layer of the display panels according to the second embodiment of the disclosure. In the embodiment, the second dam structure 17 and the inorganic capping layer 11 (i.e. the first inorganic capping layer) at least partially overlap. The second dam structure 17 in FIG. 6A is formed on the inorganic capping layer 11 (i.e. both of the projection areas completely overlap). Alternatively, the second dam structure 17 in FIG. 6B partially overlaps the inorganic capping layer 11 (i.e. both of the projection areas partially overlap). As shown in FIG. 6B, a portion of the second dam structure 17 is formed on the inorganic capping layer 11, and the other portion is formed on the substrate 10.

Practically, the second dam structure 17 and the first dam structure 16' can be formed during fabrication of the pixel define layer 131. Therefore, the second dam structure 17, the first dam structure 16' and the pixel define layer 131 may include the same material. However, the disclosure is not limited thereto. In one embodiment, the second dam structure 17 and the first dam structure 16' are made of the materials comprising carbon (C) or oxygen (O) or nitrogen (N).

Figure 7A:
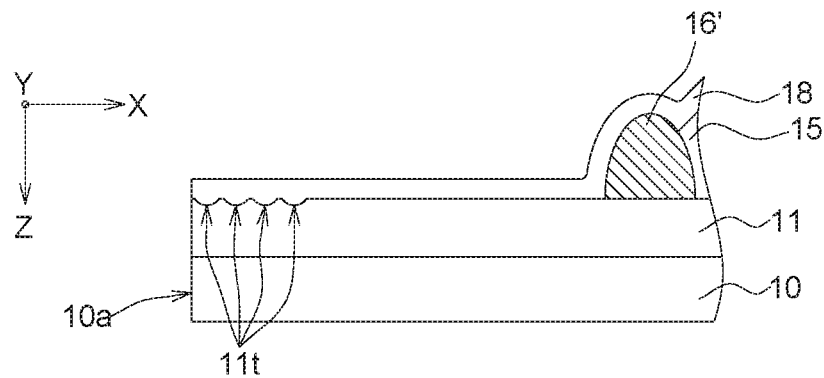
FIG. 7A-FIG. 7C show three different types of the trenches of the inorganic capping layer, the first dam structure and/or the second dam structure of the display panels according to the embodiments of the disclosure.
Figure 7B:
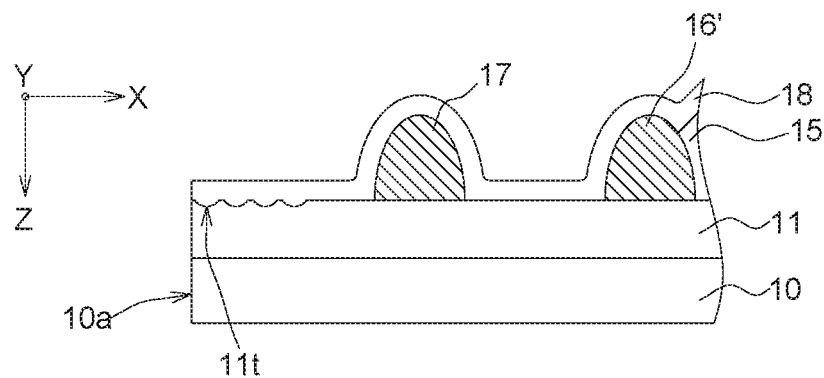
Figure 7C:
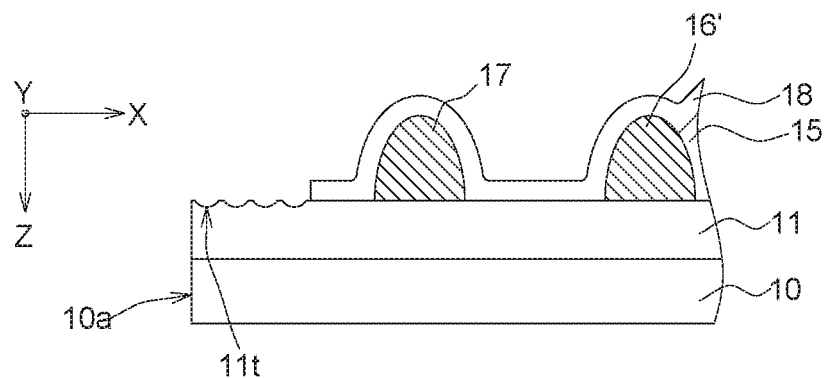

Additionally, in practical applications, the display panel of the first embodiment and/or second embodiment may further comprise a trench pattern (ex: several trenches) formed on the top surface of the inorganic capping layer 11. As shown in FIG. 7A, the inorganic capping layer 11 of the first embodiment further comprises several trenches 11t, and the trenches 11t are positioned between the first dam structure 16' and the first lateral surface 10a of the substrate 10 in top view, wherein the second inorganic capping layer 18 on the organic capping layer 15 fills those trenches 11t (but the disclosure is not limited thereto. The second inorganic capping layer 18 may not fully fill those trenches 11t or only fill parts of them). As shown in FIG. 7B and FIG. 7C, the inorganic capping layer 11 further comprises several trenches 11t positioned between the second dam structure 17 and the first lateral surface 10a of the substrate 10 in top view. The second inorganic capping layer 18 covers the second dam structure 17 and fills the trenches 11t (FIG. 7B) or does not fill the trenches 11t (FIG. 7C). In other embodiments, the inorganic capping layer 11 of the display panel of the first or second embodiment may comprise several bumps or have uneven surface. The disclosure has no limitation thereto.

Two examples are provided below for illustration. A range of the values of the first maximum dam height Hdam can be obtained by using the equation (1). Please also refer to FIG. 2 and above descriptions of the related elements. It is noted that the thickness $H_2$ of the organic capping layer 15 is determined from the top surface of the electrode 132 to the top surface 15a of the organic capping layer 15 in the normal direction of the substrate 10. Compared to other layers, the thickness $H_{CE}$ of the electrode 132 or the thickness of other not-shown layer is relative small, so that the value of the thickness $H_{CE}$ of the electrode 132 is omitted in the calculation below.

Example 1

When the thickness $H_0$ of the planarization layer 130 is 1.255 μm, the thickness $H_1$ of the pixel define layer 131 is 1.412 μm and the thickness $H_2$ of the organic capping layer 15 is 4.65, the first distance H would be 7.317 μm. Please see Table 1. When the dam width Wdam is 40.3 μm and the minimum distance Lsr is 1136.7 μm, it is calculated that the value of the first maximum dam height Hdam is between 1.26 μm and 6.99 μm according to the equation (1). When the values of all the physical parameters are fixed except the minimum distance Lsr is changed to 117.24 μm, it is calculated that the value of the first maximum dam height Hdam is between 0.34 μm and 6.93 μm according to the equation (1). In one embodiment, the value of the first maximum dam height Hdam can be determined as 3.6 μm.

Values of the upper limits and the lower limits obtained according to the equation (1) are listed in Table 1.

TABLE 1

| First distance, | Minimum distance, | Dam width, | Theoretical value (Upper limit) First maximum dam height, Hdam | Theoretical value (Lower limit) |
|---|---|---|---|---|
| H | Lsr | Wdam | Lorg = a × Lsr | Lorg = b × Lsr |
| 7.317 μm | 1136.7 μm | 40.3 μm | 6.99 μm | 1.26 μm |
| 7.317 μm | 117.24 μm | 40.3 μm | 6.93 μm | 0.34 μm |

Example 2

In Example 2, it is assumed that no planarization layer 130 exists, and the thickness $H_{CE}$ of the electrode 132 or the thickness of other not-shown layer is relative small so that the value of the thickness $H_{CE}$ of the electrode 132 is omitted. When the thickness $H_1$ of the pixel define layer 131 is 1.28 μm and the thickness $H_2$ of the organic capping layer 15 is 13.26, the first distance H would be 14.54 μm. Please see Table 2. The value of the first maximum dam height Hdam can be obtained according to the equation (1) by substituting the values of the dam width Wdam and the minimum distance Lsr in Table 2. In one embodiment, the value of the first maximum dam height Hdam can be determined as 3.25 μm.

Values of the upper limits and the lower limits obtained according to the equation (1) are listed in Table 2.

TABLE 2

| First distance, H | Minimum distance, Lsr | Dam width, Wdam | Theoretical value (Upper limit) First maximum dam height, Hdam Lorg = a × Lsr | Theoretical value (Lower limit) Lorg = b × Lsr |
|---|---|---|---|---|
| 14.54 μm | 393 μm | 48.3 μm | 13.85 μm | 1.99 μm |
| 14.54 μm | 408 μm | 48.9 μm | 13.85 μm | 2.01 μm |
| 14.54 μm | 210 μm | 48.2 μm | 13.81 μm | 1.36 μm |
| 14.54 μm | 1651.9 μm | 48.2 μm | 13.87 μm | 2.55 μm |

Additionally, in one embodiment, a ratio of the first maximum dam height to the dam width Wdam can be in a range of 0.06 to 0.09 (ex: 3.6/40.3). It is known to people skilled in the art that the aforementioned dimensions such as the thickness H0 of the planarization layer 130, the thickness $H_1$ of the pixel define layer 131, the thickness $H_2$ of the organic capping layer 15 and other related elements can be varied and determined according to the product requirements of the application (ex: the requirements of electrical properties and limitations). Therefore, those dimensional values are disclosed for exemplification, not for limiting the present disclosure.

According to the aforementioned descriptions, at least one dam structure disposed in an non-displaying area of a display panel of the embodiment is able to control the boundary of the organic capping layer during thin film encapsulation, thereby solving the overflow problem of an organic capping layer during thin film encapsulation procedure of the traditional structure, and preventing water vapor/oxygen permeance into the display panel. Also, setting two dam structures such as the first dam structure 16 and the second dam structure 17 disclosed in the second embodiment can ensure that the organic capping layer would not be overflowed to the lateral surface of the substrate, prevent water vapor/oxygen permeance at the lateral sides, and also increase the path for water vapor/oxygen permeance by extending the length of the organic capping layer. Accordingly, the designs of the embodiments do significantly improve the quality of the display panel.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
    a substrate, having a displaying area and a non-displaying area adjacent to the displaying area, and the substrate having a first lateral surface;
    a first inorganic capping layer, disposed on the substrate and corresponding to the non-displaying area, and the first inorganic capping layer having a first top surface;
    a first electrode, disposed on the first inorganic capping layer and corresponding to the non-display area, the first electrode having a second lateral surface, and the second lateral surface adjacent to the first lateral surface;
    an organic capping layer, disposed on the substrate and overlapping at least a portion of the first electrode, wherein the organic capping layer has a second top surface, and a first distance H is between the first top surface and the second top surface in a normal direction of the substrate; and
    a first dam structure, disposed on the substrate and corresponding to the non-displaying area, the first dam structure disposed between the first lateral surface and the organic capping layer in top view, the first dam structure having a first maximum dam height (Hdam) and a dam width (Wdam), and the first dam structure comprising a third lateral surface adjacent to the second lateral surface, wherein a minimum distance from the third lateral surface to the second lateral surface in top view is defined as a second distance Lsr;
    wherein the first maximum dam height (Hdam), the dam width (Wdam), the first distance H, and the second distance Lsr conform to the following equation: H×(0.1870−Wdam/(2.46×Lsr))≤Hdam≤H×(0.9548−Wdam/(44.26×Lsr)).

2. The display panel according to claim 1, wherein the first dam structure is disposed on the first top surface of the first inorganic capping layer.

3. The display panel according to claim 1, wherein a ratio of the first maximum dam height to the dam width Wdam is in a range of 0.06 to 0.09.

4. The display panel according to claim 1, further comprising a second inorganic capping layer disposed on the organic capping layer and overlapping at least a portion of the first dam structure.

5. The display panel according to claim 1, wherein the first inorganic capping layer further comprises a plurality of trenches, and the plurality of trenches are disposed between the first dam structure and the first lateral surface in top view.

6. The display panel according to claim 1, further comprising a second dam structure disposed between the first dam structure and the first lateral surface in top view.

7. The display panel according to claim 6, wherein the second dam structure has a second maximum dam height, and the second maximum dam height is greater than the first maximum dam height.

8. The display panel according to claim 6, wherein the first dam structure is spaced apart from the second dam structure by a distance ranged from 45 μm to 105 μm.

9. The display panel according to claim 6, wherein the second dam structure overlaps at least a portion of the first inorganic capping layer.

10. The display panel according to claim 6, wherein the first inorganic capping layer further comprises a plurality of trenches, and the plurality of trenches are positioned between the second dam structure and the first lateral surface in top view.

11. The display panel according to claim 6, further comprising a second inorganic capping layer disposed on the organic capping layer and overlapping at least a portion of the second dam structure.

12. The display panel according to claim 1, further comprising a pixel define layer, wherein the pixel define layer is disposed between the first inorganic capping layer and the first electrode in top view.

* * * * *